(12) United States Patent
Bellaouar et al.

(10) Patent No.: US 10,079,597 B1
(45) Date of Patent: Sep. 18, 2018

(54) CIRCUIT TUNING SCHEME FOR FDSOI

(71) Applicant: GLOBALFOUNDRIES Inc., Grand Cayman (KY)

(72) Inventors: Abdellatif Bellaouar, Richardson, TX (US); Arul Balasubramaniyan, Plano, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/459,867

(22) Filed: Mar. 15, 2017

(51) Int. Cl.
| | |
|---|---|
| *H03K 17/16* | (2006.01) |
| *H01L 27/092* | (2006.01) |
| *H01L 29/78* | (2006.01) |
| *H01L 29/06* | (2006.01) |
| *H03K 3/012* | (2006.01) |

(52) U.S. Cl.
CPC ....... *H03K 17/161* (2013.01); *H01L 27/0928* (2013.01); *H01L 29/0649* (2013.01); *H01L 29/7838* (2013.01); *H03K 3/012* (2013.01)

(58) Field of Classification Search
CPC ............. H01L 27/0928; H01L 29/0649; H01L 29/7838; H03K 3/012; H03K 17/161
USPC .................................................. 327/534, 564
See application file for complete search history.

(56) References Cited

U.S. PATENT DOCUMENTS

| | | | |
|---|---|---|---|
| 6,275,094 B1 | 8/2001 | Cranford, Jr. et al. | |
| 8,183,630 B2* | 5/2012 | Batude | H01L 27/11 257/296 |
| 8,416,009 B2 | 4/2013 | Cranford, Jr. et al. | |
| 8,508,283 B2* | 8/2013 | Kawahara | H01L 27/1203 323/907 |
| 8,729,908 B2 | 5/2014 | Cranford, Jr. et al. | |
| 2015/0287722 A1* | 10/2015 | Giraud | H01L 27/1203 257/348 |
| 2017/0324385 A1* | 11/2017 | McKay | G06F 17/5045 |
| 2017/0338343 A1* | 11/2017 | Baudot | H01L 21/82381 |

OTHER PUBLICATIONS

Nauta, A CMOS Transconductance-C Filter Technique for Very High Frequencies, Journal, Feb. 1992, p. 142-153. vol. 27 No. 2, IEEE Journal of Solid-State Circuits.

* cited by examiner

*Primary Examiner* — William Hernandez
(74) *Attorney, Agent, or Firm* — David Cain; Hoffman Warnick LLC

(57) ABSTRACT

A method of circuit tuning, including: applying a first positive voltage and a second positive voltage to a circuit structure, the circuit structure including a p-type metal-oxide semiconductor (PMOS) device with a flipped well transistor and an n-type metal-oxide semiconductor (NMOS) device; adjusting a first threshold voltage in response to the first positive voltage being applied to a p-well region of the NMOS device and adjusting a second threshold voltage in response to the second positive voltage being applied to the p-well region of the PMOS device; and compensating the first threshold voltage and the second threshold voltage through a backgate of the PMOS device and the NMOS device relative to a same common mode voltage.

18 Claims, 6 Drawing Sheets

CIRCUIT TUNING SCHEME FOR FDSOI

TECHNICAL FIELD

The disclosure relates generally to circuit structures for field effect transistors (FETs). More specifically, embodiments of the present disclosure include a circuit configuration (topology) and a circuit tuning scheme for fully depleted semiconductor-on-insulator (FDSOI) transistor technologies.

BACKGROUND

The variation in threshold voltage (Vth) of field effect transistors (FET), i.e., the voltage required to permit or prevent current flow between its source and drain terminals, leads to undesirable effects and limitations in the operating range of integrated circuits. Many analog circuits depend on the use of transistors and the threshold matching inherent to those circuits. Conventional complementary metal-oxide semiconductor (CMOS) technology can exhibit device Vth mismatches in the multi-millivolt range. Analog circuits using CMOS including analog to digital converters, comparators, and certain types of amplifiers are susceptible to Vth mismatches. Altering the Vth of FETs by corresponding changes in circuit design may compensate for variability in the manufacturing process. Typically, charge pumps or other circuits are used to change the bias on the substrate or backgate of the FET to alter the Vth of the FETs. However, this form of compensation conventionally affects the entire integrated circuit because the substrate of at least one of the device types, p- or n-, appears throughout the device structure. With the advent of silicon-on-insulator (SOI) technology, the backgates of both device types 'p' and 'n' are now isolated for each individual transistor. SOI technology may allow users to drive isolated backgates of a transistor to either a high reverse bias of the source-substrate junction to minimize source-drain leakage current in the "off" mode, and to a slightly forward biased region of operation to enhance the source-drain current in the "on" mode.

SUMMARY

A first aspect includes a method of circuit tuning, including: a method of circuit tuning, including: applying a first positive voltage and a second positive voltage to a circuit structure, the circuit structure including a p-type metal-oxide semiconductor (PMOS) device with a flipped well transistor and an n-type metal-oxide semiconductor (NMOS) device; adjusting a first threshold voltage in response to the first positive voltage being applied to a p-well region of the NMOS device and adjusting a second threshold voltage in response to the second positive voltage being applied to the p-well region of the PMOS device; and compensating the first threshold voltage and the second threshold voltage through a backgate of the PMOS device and the NMOS device relative to a same common mode voltage.

A second aspect relates to a circuit tuning structure, including: a substrate including a deep n-well region; a flipped well p-type metal-oxide semiconductor (PMOS) device including: a first PMOS n-well region positioned over the deep n-well region and connected to a supply voltage, a first substrate p-well region connected to a ground and laterally abutting a first side of the PMOS n-well region, and a second substrate PMOS p-well region with an opposing n-well region electrically coupled to a backgate, and an n-type metal-oxide semiconductor (NMOS) device positioned over the deep n-well region and laterally abutting the PMOS device, the NMOS device including: an NMOS n-well region laterally abutting the second substrate PMOS p-well region electrically coupled to the backgate, and an NMOS p-well region electrically coupled to a gate wherein, the first NMOS p-well region is laterally abutting the NMOS n-well region; and a control circuit configured to apply a first positive backgate voltage to the first substrate PMOS p-well region and a second positive backgate voltage to the NMOS p-well region; and, the first positive backgate voltage and the second positive backgate voltage being inversely proportional to each other relative to a common mode voltage.

A third aspect of the disclosure relates to a circuit tuning structure, including: a substrate including a deep n-well region; a flipped well p-type metal-oxide semiconductor (PMOS) device above the deep n-well, the PMOS device including: a first PMOS n-well region positioned over the deep n-well region and connected to a supply voltage, a first substrate-PMOS p-well region connected to a ground and laterally abutting a first side of the PMOS n-well region, and a second substrate PMOS p-well region on an opposing second side of the PMOS n-well region electrically coupled to a backgate; and a flipped well n-type metal-oxide semiconductor (NMOS) device positioned over the deep n-well region and laterally abutting the flipped well PMOS device, the flipped well NMOS device including: an NMOS n-well region electrically coupled to a gate and laterally abutting the second substrate PMOS p-well region, a control circuit configured to apply a first positive backgate voltage to the first substrate PMOS p-well region and a second positive backgate voltage to the NMOS n-well region; and the first positive backgate voltage and the second positive backgate voltage being inversely proportional to each other.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
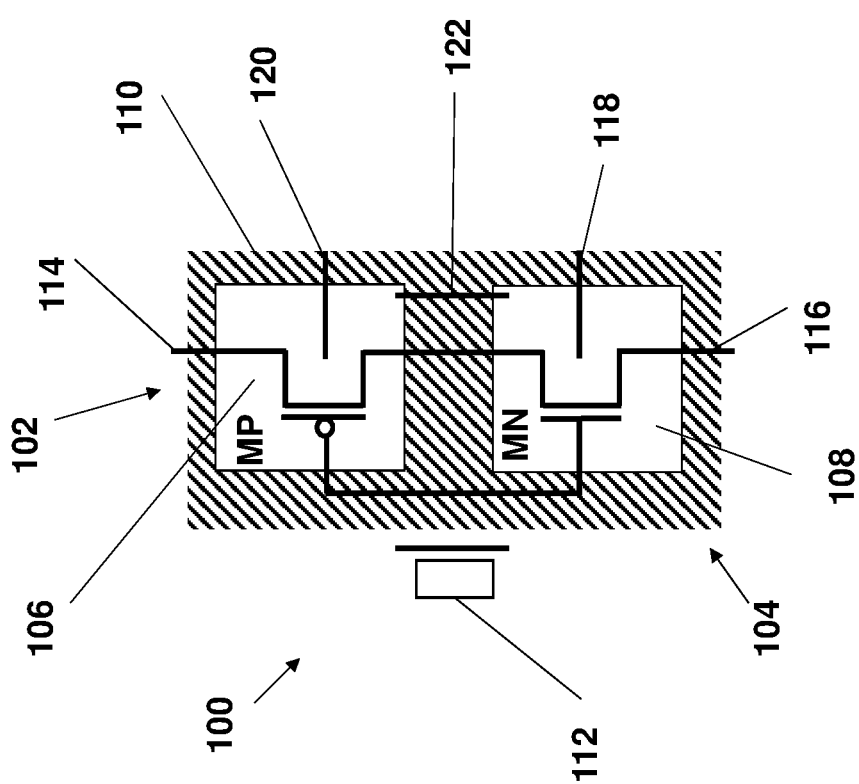
FIG. 1 shows a schematic plan view of an integrated circuit (IC) structure with a flipped well PMOS device, and an NMOS device according to embodiments of the disclosure.

It is noted that the drawings of the disclosure are not necessarily to scale. The drawings are intended to depict only typical aspects of the disclosure, and therefore should not be considered as limiting the scope of the disclosure.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure relate to a circuit tuning scheme for FDSOI transistors, and structures for doing the same. FDSOI, is a planar process technology that relies on two primary innovations. First, an ultra-thin layer of insulator, called the buried oxide, is positioned on top of the base silicon. Then, a very thin silicon film implements the transistor channel. Due to its thinness, there is no need to dope the channel, thus making the transistor Fully Depleted. The combination of these two innovations is called "ultra-thin body and buried oxide Fully Depleted SOI" or UTBB-FDSOI. By construction, FD-SOI enables much better transistor electrostatic characteristics versus conventional bulk technology. The buried oxide layer lowers the parasitic capacitance between the source and the drain. It also efficiently confines the electrons flowing from the source to the drain, dramatically reducing performance-degrading leakage currents.

The Vth may generally refer to the voltage at the gate terminal of the transistor (with respect to the source), at or above which the transistor actively conducts current between the source and drain. Viewed in another way, the Vth may be the voltage at which a low resistance current path is formed from the source to the drain. When the gate to source voltage is less than the Vth, the transistor is not actively conducting current. Leakage current may be flowing when the gate to source voltage is less than the Vth, but the leakage current is significantly smaller than the active current (e.g., by orders of magnitude). The transistor is referred to as "on" when the gate to source voltage exceeds the Vth and "off" when the gate to source voltage does not exceed the threshold voltage.

The nominal Vth may be the Vth expected of the transistor based on the design of the transistor (e.g., channel length, oxide thickness and material, etc.). Embodiments of the present disclosure can reduce mismatches between the threshold voltages of multiple FDSOI transistors as discussed herein. The Vth is referred to as nominal because in practice the actual threshold voltage may vary based on process variations, as well as operating conditions such as temperature.

It is understood that the various process steps discussed herein can be implemented on an SOI substrate. The SOI substrate and SOI layer material may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). For a given process technology node, there may be two or more types of transistors available with differing threshold voltages. For example, in one embodiment described in more detail below, there are four types of transistors available (listed from lowest threshold voltage to highest threshold voltage): super low threshold voltage (SLVT), low threshold voltage (LVT), regular threshold voltage (RVT), and high threshold voltage (HVT) available in the FDSOI process. The SLVT and LVT devices are in flipped well configurations and are different from RVT and HVT devices that are in conventional wells.

Another advantage of FDSOI over bulk CMOS technology or FinFETs is the capability of the former to manipulate Vth through back biasing (biasing a device through a backgate). The back-biasing of FDSOI enables designers to operate nanometer-sized circuits with both efficiency and low power consumption. Positive voltage is typically needed for the NMOS SLVT and LVT devices and negative voltages are typically needed for the PMOS SLVT and LVT devices for Forward backgate bias to reduce the Vth. The embodiments described herein provide a solution to tuning the back-bias of the well without the use of the negative supply voltage while keeping only positive supply lower than the actual supply voltage (e.g., 1.4V) and therefore eliminating the need for both positive and negative charge pumps. As used herein, a "deep n-well" is an n-type doping region in a p-type substrate that is implanted deeper than a standard n-well. As used herein, a "flipped well configuration" includes a PMOS transistor that is arranged above a p type well while the NMOS transistor is arranged above an n type well. Those transistors may be referred to as low threshold voltage (LVT) transistors.

Devices and interconnect have variations in film thickness, lateral dimensions, and doping concentrations. These variations occur from one wafer to another, between dice on the same wafer, and across an individual die; variation is generally smaller across a die than between wafers. These effects are sometimes called inter-die and intra-die variations; intra-die variation is also called process tilt because certain parameters may slowly and systematically vary across a die. For example, if an ion implanter delivered a greater dose nearer the center of a wafer than near the periphery, the threshold voltages might tilt radially across the wafer. From the designer's point of view, the collective effects of process and environmental variation can be lumped into their effect on transistors: typical (also called nominal), fast, or slow.

Referring to FIG. 1, an embodiment of a schematic view of a circuit tuning structure 100 with a flipped well PMOS device 102, and an NMOS device 104 is shown. PMOS device 102 may be a SLVT transistor, and NMOS device 104 may be a RVT transistor. Circuit tuning structure 100 may include a flipped well PMOS device 102 including a first p-well 106, and NMOS device 104 including a second p-well region 108, upon which they are formed and electrically isolated by a deep n-well region 110. N-well region may be formed, for example, by implanting n-type dopant such as Phosphorus (P), Arsenic (As), or the like. Additionally, flipped well PMOS device 102 and NMOS device 104 function as an inverter based configuration that are biased by two separate positive control voltages provided to the backgate, linked by a common voltage characteristic provided by a control circuit 112, and isolation through the deep n-well region 110 which is connected to the highest supply voltage available (approximately 1.8-2.5 v). The Vt change characteristic is described further in FIG. 4 where curves show decreasing Vt (Vtn) for increasing backgate voltage from common mode voltage Vcm for the NMOS device 104 and increasing Vt (Vtp) for PMOS device 102. The backgate voltages are adjusted inversely to correct for Vt characteristic and this approach is essential for the mentioned inverter configuration to compensate for process and temperature variation providing significant advantages in circuit design like power consumption and reduction in circuit noise in many applications like GmC cells, RF Local oscillator buffer chain, and Delay cells in DLL. Flipped well PMOS device 102 drain is connected to AVDD 114 for circuit tuning structure 100, while NMOS device 104 source is electrically coupled to a ground AVSS 116.

Further referring to FIG. 1, backgate 118 of PMOS device 102, and backgate 118 of NMOS device 120 can be adjustable through this common voltage characteristic 112 to match the Vth of both devices (Vcm) 122 of circuit tuning structure 100. The semiconductor material in deep n-well region 110 can be negatively doped, e.g., with ions of arsenic and/or phosphorus, and provides a level of isolation between flipped well PMOS device 102 and NMOS device 104.

Figure 2:
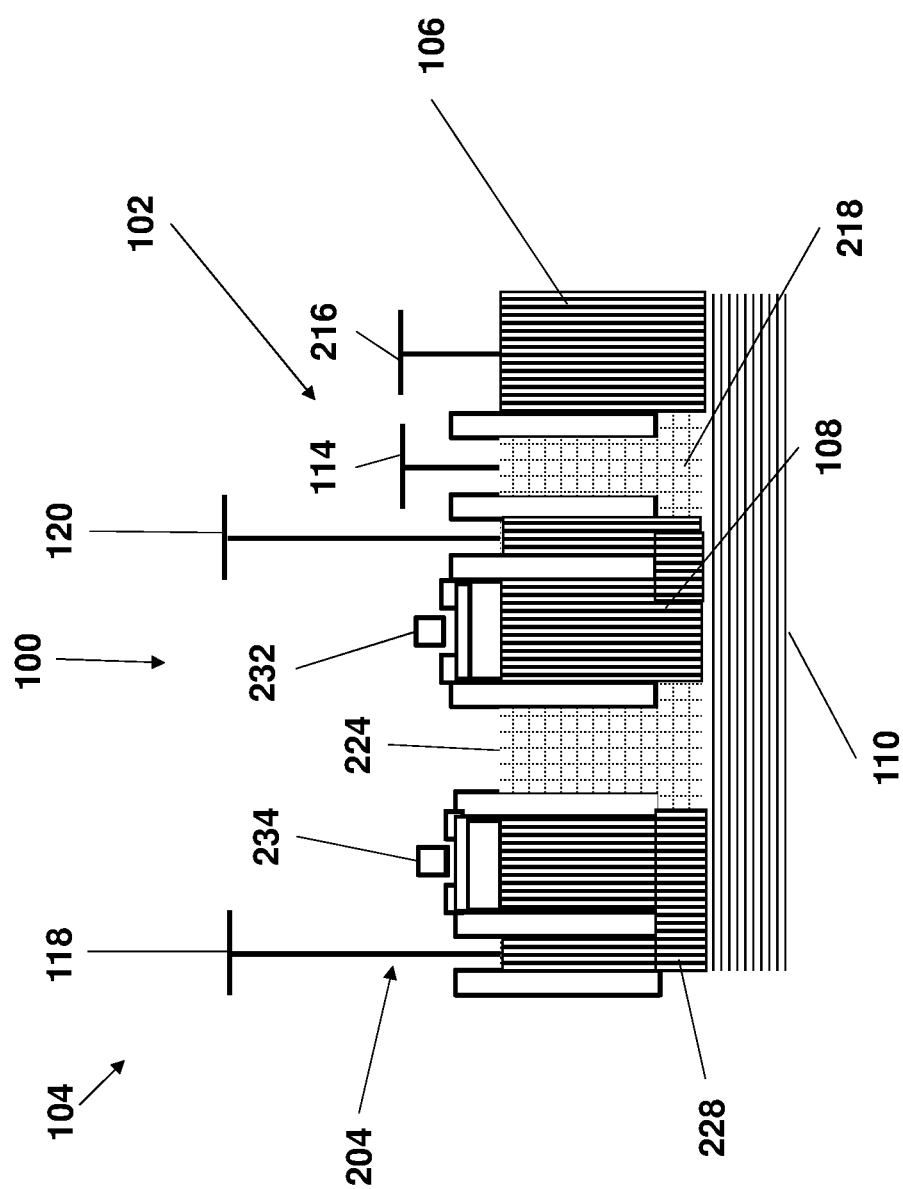
FIG. 2 shows a cross sectional view of an IC structure with a flipped well PMOS device and an NMOS device above a deep n-well region according to embodiments of the disclosure.

Referring to FIG. 2, a cross sectional view of the FIG. 1 is an embodiment of IC structure 100 including a flipped well PMOS device 102 and an NMOS device 104 above a deep n-well region 110 is shown. Flipped well PMOS device 102 can include a n-well region 218 positioned over deep n-well region 110 which is connected to the highest Avdd 114 available (Approximately 1.8-2.8 v). Flipped well PMOS device 102 includes a substrate p-well region 106 connected to ground and laterally abutting an n-well region 218, and the substrate of the second region of PMOS p-well region 108 to which a first positive backgate voltage 120 is applied. The combined device can also include an NMOS device 104 positioned over the deep n-well region and laterally abutting the flipped well transistor PMOS device 102.

FIG. 2, NMOS device 104 can include an n-well region 224 laterally abutting the substrate of the second region of PMOS p-well region 108 and an NMOS p-well region 228. A control circuit additionally is electrically connected to the second positive backgate voltage 118 to the NMOS p-well region 228 of the transistor NMOS device 104; and wherein the first positive backgate voltage 120 and the second positive backgate voltage 118 change in opposite direction with respect to Vcm.

Figure 3A:
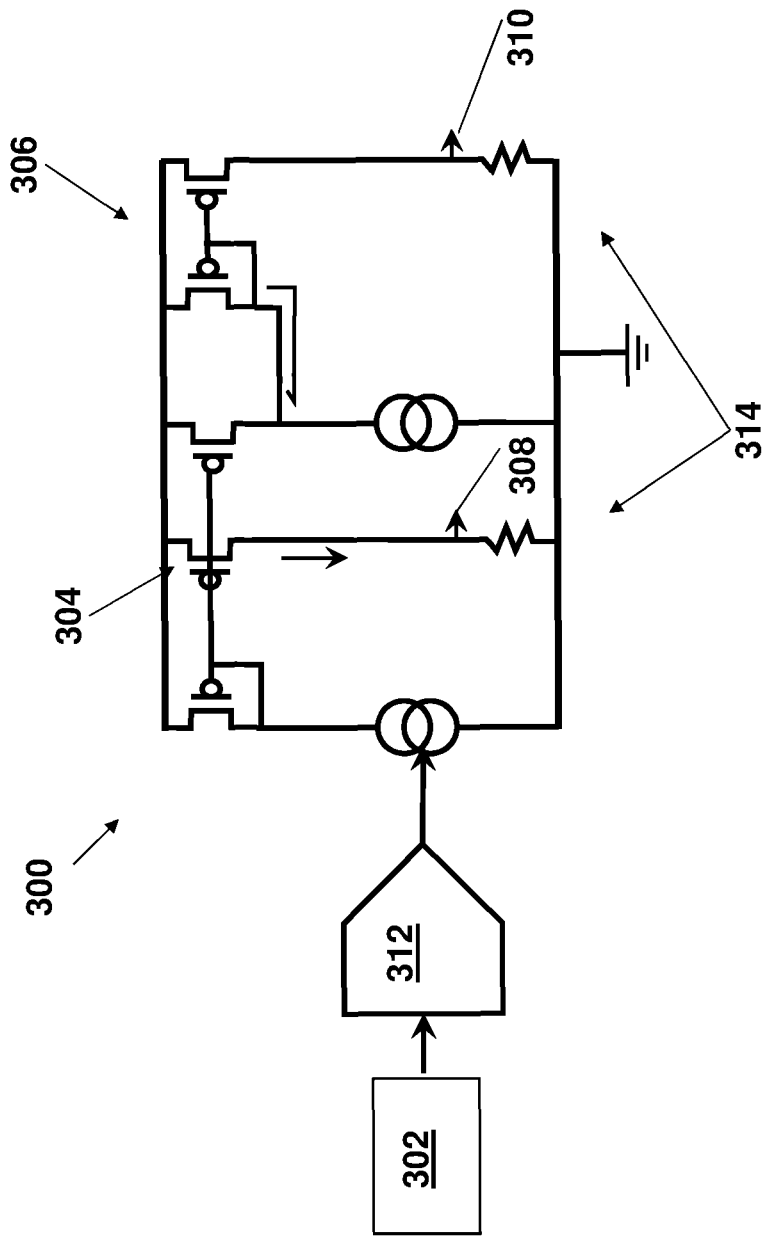
FIG. 3a shows a schematic view of a bias generating circuit for the two backgates of circuit structure according to embodiments of the disclosure.
Figure 3B:
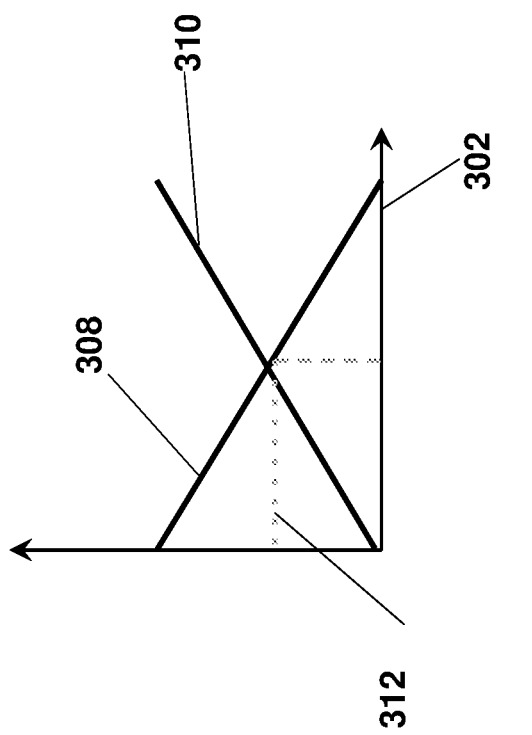
FIG. 3b shows a chart of the operational characteristics of a bias generating circuit according to embodiments of the disclosure.

Referring to FIGS. 3a and 3b, an embodiment of a bias generating circuit 300 for the first and second mentioned backgates and its operating curve is shown. Circuit 300 provides a dual voltage generation circuit for Vbbp 308 and Vbbn 310. Two generated voltages, a Vbbp 308, and a Vbbn 310, can change in opposite directions according to the received input code from control circuit 302 relative to same common mode voltage. Additionally, circuit 300 may also optionally include a digital to analog converter (DAC) 312 and a plurality of resistor-capacitor (RC) filter circuits 314 to reduce electrical noise. The DAC is configured to accept a certain number of bits (e.g., 6, 8, 12). This bias generation circuit 300 is based on generating two opposite voltages to the PMOS and NMOS devices backgates while still both being positive in respect to ground. In nominal conditions, operation of the embodiments described above in FIG. 1 and below in FIG. 5, Vbbp 308 and Vbbn 310 are equal to the common mode voltage but move in opposite direction with respect to Vcm to track Vt changes over process and temperature and in response to input code from control circuit 302.

Figure 4:
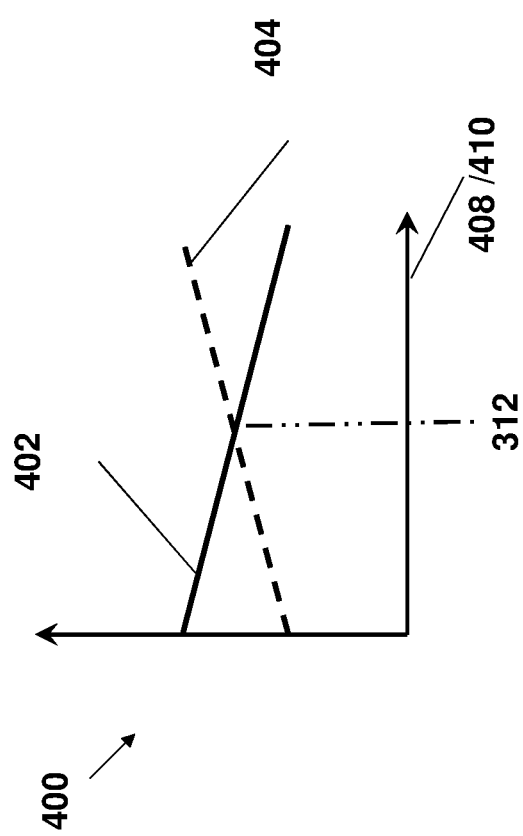
FIG. 4 shows a chart of the voltage characteristics of the bias generating circuit according to embodiments of the disclosure.
Figure 5:
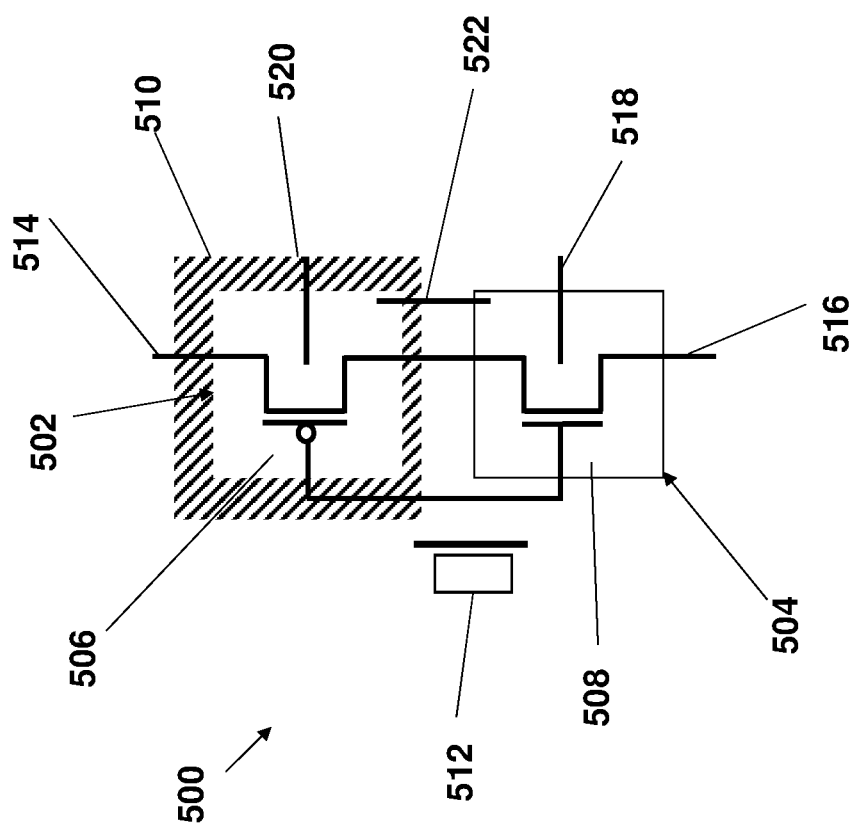
FIG. 5 shows a schematic view of an IC structure with a flipped well PMOS device and a flipped well NMOS device according to embodiments of the disclosure.

Referring to FIG. 4, showing a chart 400 of the voltage characteristics of the each respective embodiment. The solid line 402 is the threshold voltage of NMOS device (Vtn) 402 for increasing backgate voltage, and the dotted line is the threshold voltage of PMOS device (Vtp) 404 for increasing backgate voltage, 312. For nominal conditions, threshold voltage Vtn 402 of the NMOS device and threshhold voltage of Vth 404 are equal when biased at common mode voltage Vcm 312. Due to process when Vt increases for PMOS and NMOS device the circuit lowers Vbbp to reduce Vtp and increases Vbbn to reduce Vtn thus compensating for the increase in Vt. The voltage characteristics shown are due to the electrically coupled nature of flipped well PMOS device FIG. 1, 102, 502 (FIG. 5) and NMOS device 104 (FIG. 1), (being a flipped well NMOS device in embodiment discussed in FIG. 5), being supplied by these positive control voltages though a shared backgate while having p-well regions 106 (FIG. 1), 108 (FIG. 1), 506 (FIG. 5), and being isolated by the deep n-well region 110 (FIG. 1), 510 (FIG. 5). Because Vbbn 410 and Vbbp 408 are inversely proportional and supplied by only positive voltages, there is no need to use a negative charge pump in the circuit structure, which saves on time, space and cost.

Referring to FIG. 5, a schematic view of an embodiment of an IC structure 500 with a flipped well PMOS device 502, and a flipped well NMOS device 504 is shown. PMOS device 502 may be a SLVT transistor, and NMOS device 504 may be a SLVT transistor. Flipped well PMOS device 502 includes the first p-well region 506, and flipped well NMOS device 504 with an n-well region 508, are electrically isolated by the deep n-well region 510. Additionally, flipped well PMOS device 502 and flipped well NMOS device 504 function as an inverter based configuration that are biased by two separate positive control voltages provided to the backgate, linked by a common voltage characteristic provided by a control circuit 512, and isolation through the deep n-well region 510. This common voltage characteristic is the same as described in FIG. 4 and the alternative embodiment detailed in FIG. 1 and FIG. 2. Flipped well PMOS device 502 source is connected to supply voltage (Avdd) 514 for circuit tuning structure 500, while flipped well NMOS device 504 has its source connected to ground (Avss) 516.

Further referring to FIG. 5, the backgate 520 of PMOS device 502 and backgate 518 of NMOS device 504 are adjustable through this common voltage characteristic 512 to adjust the threshold voltage of both devices for process variation. Relative to common mode voltage, Vcm 522 of circuit tuning structure 500. The semiconductor material in deep n-well region 510 provides a level of isolation between flipped well PMOS device 502 and flipped well NMOS device 504. In contrast to the FIG. 1 embodiment, the presence of flipped NMOS device 504 with n-well region 508 is also isolated by the deep n-well region 510 from flipped well PMOS device 502 first p-well region 506 to provide the voltage characteristic as described in FIG. 4.

In operation, a method according to embodiments of the disclosure may include applying a first positive voltage 118 (FIG. 1), 518 (FIG. 5), and a second positive voltage 120 (FIG. 1), 520 (FIG. 5), to a circuit structure 100 (FIG. 1), 500 (FIG. 5). Circuit structure 100 (FIG. 1), 500 (FIG. 5), including a p-type metal-oxide semiconductor (PMOS) device 102 (FIG. 1), 502 (FIG. 5), with a flipped well transistor and an n-type metal-oxide semiconductor (NMOS) device 104 (FIG. 1). Alternative embodiments may include both a flipped well PMOS device 502 (FIG. 5) and a flipped well NMOS device 504 (FIG. 5). The method may also include adjusting a first threshold voltage in response to the first positive voltage 118 (FIG. 1), 518 (FIG. 5), being applied to a p-well region 108 (FIG. 1) of the NMOS device (the n-well 508 of NMOS device 504 in embodiment shown in FIG. 5) and adjusting a second threshold voltage in response to the second positive voltage FIG. 1 120, FIG. 5 520, being applied to a p-well region of the PMOS device 102 (FIG. 1), 502 (FIG. 5). In another step, the first threshold voltage and the second threshold voltage are, 522 (FIG. 5), adjusted through a backgate of the PMOS device 102 (FIG. 1), 502 (FIG. 5), and the NMOS device, relative to a common mode voltage 122 (FIG. 1). Finally, the first positive voltage 118 (FIG. 1), 518 (FIG. 5) or second positive voltage 120 (FIG. 1), 520 (FIG. 5), is modified to relative the common mode voltage 122 (FIG. 1), 522 (FIG. 5), through the backgate. The wells are biased with two positive voltages with the same nominal Vcm common mode voltage level at nominal process corner around the mid voltage range of the PMOS device 102 (FIG. 1), 502 (FIG. 5), and NMOS device 104 (FIG. 1), 504 (FIG. 5).

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present disclosure have been presented for purposes of illustration, but are not tended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of circuit tuning, comprising:
    applying a first positive voltage and a second positive voltage to a circuit structure, the circuit structure including a p-type metal-oxide semiconductor (PMOS) device with a flipped well transistor and an n-type metal-oxide semiconductor (NMOS) device;
    adjusting a first threshold voltage in response to the first positive voltage being applied to a p-well region of the NMOS device and adjusting a second threshold voltage in response to the second positive voltage being applied to a p-well region of the PMOS device; and
    compensating the first threshold voltage and the second threshold voltage through a backgate of the PMOS device and the NMOS device relative to a common mode voltage.

2. The method of claim 1, wherein the p-well region of the NMOS device and the p-well region of the PMOS device are in a shared deep n-well region.

3. The method of claim 2, further comprising biasing the deep n-well region to an n-well region of the PMOS device.

4. The method of claim 1, wherein the NMOS device comprises a flipped well transistor.

5. A circuit tuning structure, comprising:
    a substrate including a deep n-well region;
    a flipped well p-type metal-oxide semiconductor (PMOS) device including:
        a first PMOS n-well region positioned over the deep n-well region and connected to a supply voltage,
        a first substrate PMOS p-well region connected to a ground and laterally abutting a first side of the first PMOS n-well region, and
        a second substrate PMOS p-well region with an opposing n-well region electrically coupled to a backgate, and
    an n-type metal-oxide semiconductor (NMOS) device positioned over the deep n-well region and laterally abutting the PMOS device, the NMOS device including:
        an NMOS n-well region laterally abutting the second substrate PMOS p-well region, and
        an NMOS p-well region electrically coupled to the backgate wherein the first NMOS p-well region is laterally abutting the NMOS n-well region;
    a control circuit configured to apply a first positive backgate voltage to the first substrate PMOS p-well region and a second positive backgate voltage to the NMOS p-well region; and
    the first positive backgate voltage and the second positive backgate voltage being inversely proportional to each other relative to a common mode voltage.

6. The circuit tuning structure of claim 5, wherein the second substrate PMOS p-well region and the NMOS p-well region are biased at the common mode voltage for nominal process corners.

7. The circuit tuning structure of claim 5, wherein the first substrate PMOS p-well region and the NMOS p-well region share the same deep n-well region.

8. The circuit tuning structure of claim 5, wherein the deep n-well region is biased to the supply voltage of the flipped well PMOS device.

9. The circuit tuning structure of claim 5, wherein the control circuit includes a digital to analog converter (DAC).

10. The circuit tuning structure of claim 9, wherein the DAC is configured to receive 6-bits.

11. The circuit tuning structure of claim 5, wherein the control circuit includes a resistor-capacitor (RC) filter for noise reduction.

12. A circuit tuning structure, comprising:
    a substrate including a deep n-well region;
    a flipped well p-type metal-oxide semiconductor (PMOS) device above the deep n-well, the PMOS device including:
        a first PMOS n-well region positioned over the deep n-well region and connected to a supply voltage,
        a first substrate PMOS p-well region connected to a ground and laterally abutting a first side of the first PMOS n-well region, and
        a second substrate PMOS p-well region on an opposing second side of the first PMOS n-well region electrically coupled to a first backgate; and
    a flipped well n-type metal-oxide semiconductor (NMOS) device positioned over the deep n-well region and laterally abutting the flipped well PMOS device, the flipped well NMOS device including:
        an NMOS n-well region electrically coupled to a second backgate and laterally abutting the second substrate PMOS p-well region,
    a control circuit configured to apply a first positive backgate voltage to the first substrate PMOS p-well region and a second positive backgate voltage to the NMOS n-well region; and
    the first positive backgate voltage and the second positive backgate voltage being inversely proportional to each other.

13. The circuit tuning structure of claim 12, wherein the second substrate PMOS p-well region and the NMOS n-well region are biased at a common mode voltage for nominal process corners.

14. The circuit tuning structure of claim 12, wherein the first substrate PMOS p-well region and the NMOS n-well region share the same deep n-well region.

15. The circuit tuning structure of claim 12, wherein the deep n-well region is biased to the supply voltage of the flipped well PMOS device.

16. The circuit tuning structure of claim 12, wherein the control circuit includes a digital to analog converter (DAC).

17. The circuit tuning structure of claim 16, wherein the DAC is configured to receive 6-bits.

18. The circuit tuning structure of claim 12, wherein the control circuit includes a resistor-capacitor (RC) filter for noise reduction.

* * * * *